(12) United States Patent
Warkentin et al.

(10) Patent No.: US 10,746,807 B2
(45) Date of Patent: Aug. 18, 2020

(54) SYSTEM AND METHOD FOR SINGLE WIRE GROUND CHECK MEASUREMENT

(71) Applicant: Littelfuse, Inc., Chicago, IL (US)

(72) Inventors: Daryl Warkentin, Saskatoon (SK); George Fenty, Saskatoon (SK); Kim Haluik, Saskatoon (SK)

(73) Assignee: Littelfuse, Inc., Chicago, IL (US)

( * ) Notice: Subject to any disclaimer, the term of this patent is extended or adjusted under 35 U.S.C. 154(b) by 181 days.

(21) Appl. No.: 15/877,577

(22) Filed: Jan. 23, 2018

(65) Prior Publication Data
US 2019/0227111 A1 Jul. 25, 2019

(51) Int. Cl.
*G01R 31/50* (2020.01)
*G01R 31/08* (2020.01)
*G01R 31/67* (2020.01)

(52) U.S. Cl.
CPC .......... *G01R 31/50* (2020.01); *G01R 31/083* (2013.01); *G01R 31/67* (2020.01)

(58) Field of Classification Search
CPC ... G01R 31/026; G01R 31/041; G01R 31/083
USPC ........................................................ 324/510
See application file for complete search history.

(56) References Cited

U.S. PATENT DOCUMENTS

| 4,228,475 | A | 10/1980 | Sherwood | |
| 6,304,089 | B1* | 10/2001 | Paulson | G01R 31/026 324/509 |
| 9,541,595 | B2 | 1/2017 | Curtis | |
| 2014/0254050 | A1 | 9/2014 | Haines et al. | |
| 2016/0172971 | A1* | 6/2016 | Schunk | H02M 3/155 323/283 |
| 2016/0245854 | A1* | 8/2016 | Vangool | G01R 31/025 |

FOREIGN PATENT DOCUMENTS

CA 2251542 A1 4/2000

OTHER PUBLICATIONS

European Search Report for the European Patent Application No. 19152762, dated Jul. 1, 2019, 8 pages.

* cited by examiner

*Primary Examiner* — Melissa J Koval
*Assistant Examiner* — Courtney G McDonnough

(57) ABSTRACT

Embodiments herein are directed to systems and methods for single wire precision measurement of a ground termination circuit. In some embodiments, a ground check monitoring apparatus includes a voltage source connected to a single insulated ground check wire, a pilot conductor, and a ground conductor, wherein the pilot conductor has a first resistance, and the ground conductor has a second resistance. The apparatus further includes a termination device connected between the pilot conductor and the ground conductor, and a ground conductor terminal connectable to a cable pilot wire. The apparatus may further include a ground terminal connectable with a cable ground wire, wherein voltage and current measured at the ground check terminal and the ground terminal are used to determine a ground check resistance.

10 Claims, 5 Drawing Sheets

SYSTEM AND METHOD FOR SINGLE WIRE GROUND CHECK MEASUREMENT

FIELD OF THE DISCLOSURE

This disclosure relates generally to the field of ground check monitors and, more particularly, to a system and method for a single-wire resistance-based or Zener-diode-based ground check.

BACKGROUND OF THE DISCLOSURE

Industrial equipment often requires power from an external power source. The equipment may be tethered to the external power source by portable power cables, which may be referred to as trailing cables. The trailing cables are used to supply power to various types of equipment such as, for example, pumps, drills, shovels, and other machines.

In one particular example, trailing cables may be attached to mining equipment, which often poses elevated safety risks. Mine machine operators may be exposed to electrical hazards caused by trailing cable damage, a line-to-ground fault existing in the mining machine, or a broken or damaged ground conductor. To ensure proper grounding of the mining machine, a ground check monitor can be used with the trailing cables. In the event of trailing cable damage as detected by the ground check monitor, mining equipment can be de-energized to protect the mining machine operator.

Conventional ground check monitoring devices suffer from one or more problems. For example, conventional ground check measurement techniques fail to accurately measure ground resistance. It is with respect to this and other considerations that the present improvements are provided.

SUMMARY OF THE DISCLOSURE

In one approach according to the present disclosure, a ground check monitoring apparatus may include a voltage source connected to a single insulated ground check wire, a pilot conductor, and a ground conductor. The pilot conductor may have a first resistance, and the ground conductor has a second resistance. The ground check monitoring apparatus may further include a termination device connected between the pilot conductor and the ground conductor, and a ground check terminal connectable to a cable pilot wire and a ground terminal connectable with a cable ground wire. Voltage and current measured at the ground check terminal and the ground terminal may be used to determine a ground check resistance.

In another approach according to the present disclosure, a ground check termination circuit may include a voltage source connected to a single insulated ground check wire, a pilot conductor, and a ground conductor, wherein the pilot conductor has a first resistance, and the ground conductor has a second resistance. The ground check termination circuit may further include a termination device connected between the pilot conductor and the ground conductor, and a ground conductor terminal connected to the single insulated ground check wire and connectable to a cable pilot wire. The ground check termination circuit may further include a ground terminal connectable with a cable ground wire, wherein voltage and current measured at the ground check terminal and the ground terminal are used to determine a ground check resistance.

In another approach according to the present disclosure, a method for precision measurement of a ground check determination circuit may include providing a voltage source connected to a single insulated ground check wire, a pilot conductor, and a ground conductor, wherein the pilot conductor has a first resistance, and the ground conductor has a second resistance. The method may further include providing a termination device connected between the pilot conductor and the ground conductor. The method may further include providing a ground check terminal connected to the single insulated ground check wire and connectable to a cable pilot wire, and providing a ground terminal connectable with a cable ground wire. The method may further include determining a ground check resistance from voltage and current measured at the ground check terminal and the ground terminal.

BRIEF DESCRIPTION OF THE DRAWINGS

The accompanying drawings illustrate exemplary approaches of the disclosed embodiments so far devised for the practical application of the principles thereof, and in which.

Figure 1:
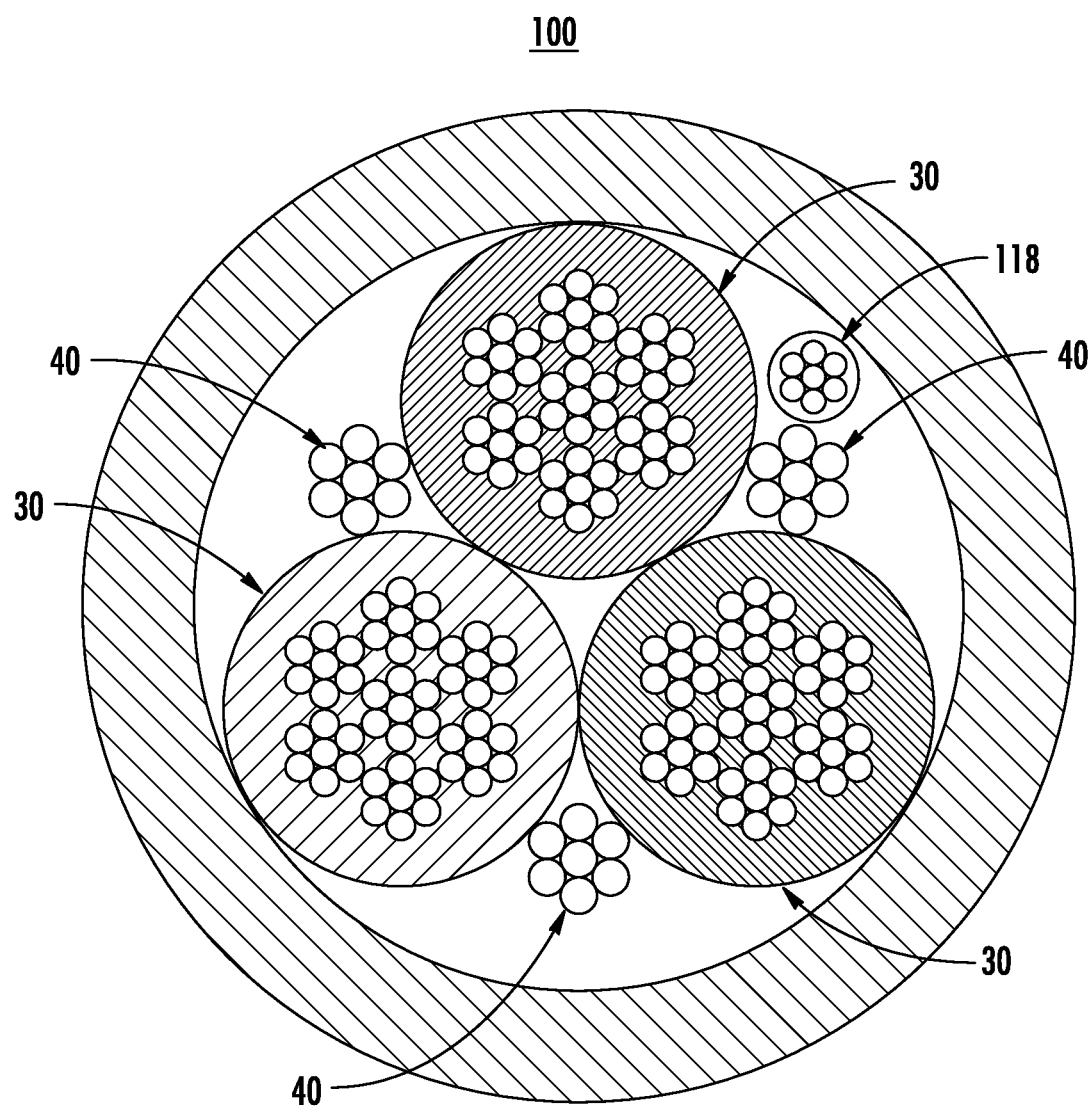
FIG. 1 illustrates a cross-sectional view of an exemplary trailing cable in accordance with the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The system/circuit may be embodied in many different forms and should not be construed as being limited to the embodiments set forth herein. Rather, these embodiments are provided so that this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of various components and their constituent parts. Said terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments that also incorporate the recited features.

Embodiments herein are directed to systems and methods for single wire precision measurement of a ground-check termination circuit. In some embodiments, a ground check monitoring apparatus includes a voltage source connected to a single insulated ground check wire (also known as a pilot conductor), and a ground conductor, wherein the single insulated ground check wire has a first resistance, and the ground conductor has a second resistance. The apparatus further includes a termination device connected between the pilot conductor and the ground conductor, and a ground check terminal connectable to a cable pilot wire and a ground terminal connectable with a cable ground wire, wherein voltages measured at the ground check terminal and the ground terminal are used to determine a ground check resistance.

The single-wire precision measurement technique for ground check termination circuits of the present disclosure is an improvement over existing prior art approaches and provides at least the following advantages. Firstly, embodiments herein reduce the effects of induced AC on the measurement of ground check resistance. Secondly, embodiments herein provide the capability for the monitoring device to measure to a sub one ohm resolution with or without AC present. Thirdly, embodiments herein provide the capability to monitor for open and short conditions of the termination device. Fourthly, embodiments herein provide the capability for the monitoring device to measure the level of AC voltage induced in the ground-check loop.

As described herein, a ground check monitoring apparatus of the present disclosure can first determine if a resistance of a termination device is shorted or not (i.e., if a termination device is in a short condition). In doing so, the ground check monitor apparatus can determine the electrical connectivity condition of the termination device. Also during this initial phase of operation, nominal or expected values of a ground resistance and a pilot wire resistance can be determined. Subsequent to the startup phase of operation, the ground check monitor of the present disclosure can periodically monitor voltages on the pilot wires and can determine if the expected voltages and/or the expected ground and pilot-wire resistances deviate from expectation, thereby resulting in a ground check fault condition. In response to a determined ground check fault condition, an alarm or signal can be provided and/or a cable likely to include the ground fault condition (e.g., a trailing cable) can be de-energized.

FIG. 1 illustrates a cross-sectional view of an exemplary trailing cable 100. As shown in FIG. 1, the trailing cable 100 may include ground conductors (e.g., ground wires) 40 and three phase conductors 30. The trailing cable 100 may further include a single insulated ground check wire (e.g., pilot wire) 118. The ground check wire 118 can be used to monitor continuity and/or integrity of the ground conductors 40. That is, the ground check wire 118 may be used to monitor continuity and/or the integrity of the ground conductors 40 to ensure that, upon occurrence of a continuity fault, ground-continuity protection is achieved.

Figure 4:
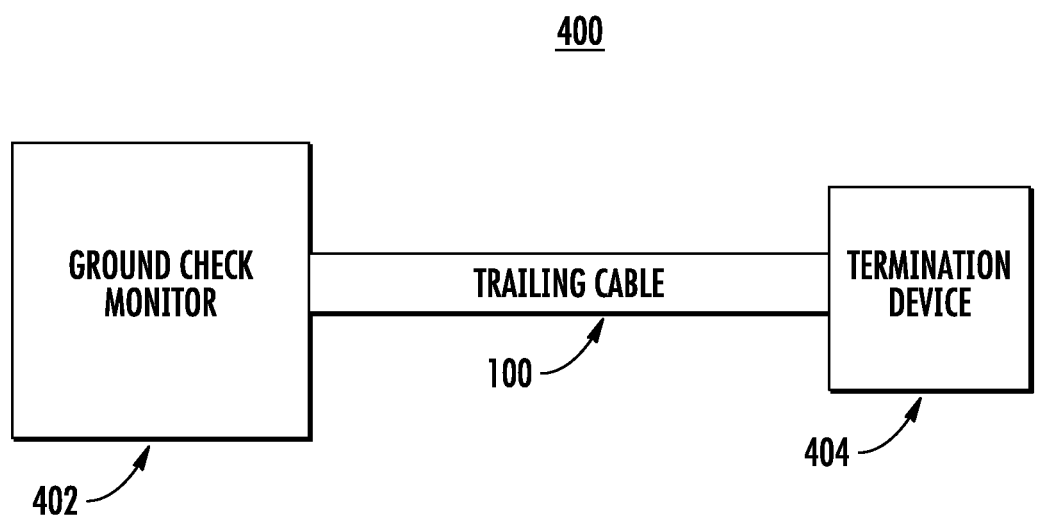
FIG. 4 illustrates a ground check monitoring system in accordance with the present disclosure.

FIG. 4 illustrates a ground check monitoring system 400 according to embodiments of the present disclosure. As shown in FIG. 4, the ground check monitoring system 400 can include a ground check monitor 402 (or ground check monitoring device 402), the trailing cable 100, and a termination device 404. The trailing cable 100 can be coupled to the ground check monitor 402 and can be coupled to the termination device 404. The termination device 404 can be a resistive termination device or a diode device. In one embodiment, the termination device 404 may be a Zener diode. The following provides further detail on the components of the ground check monitoring system 400 and its operation.

Figure 2:
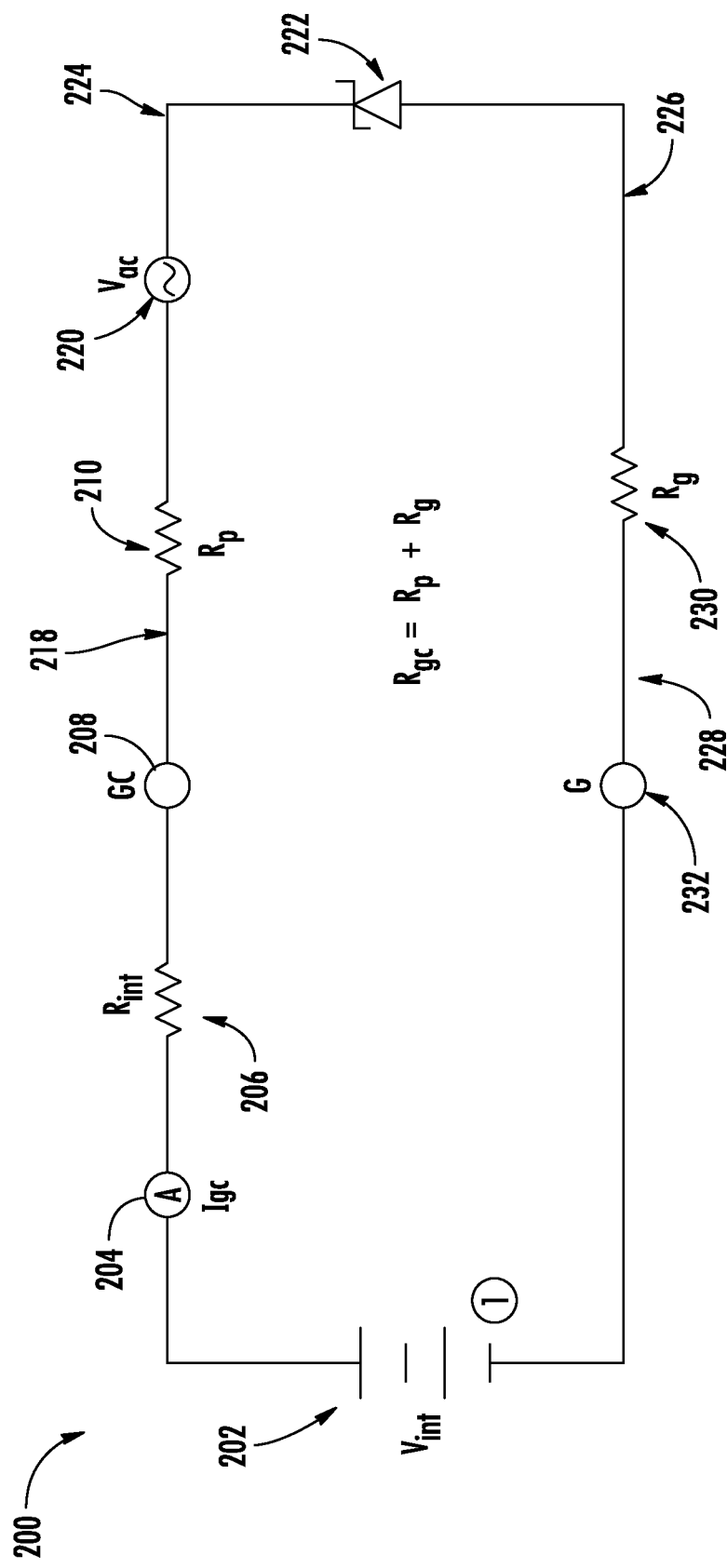
FIG. 2 illustrates a schematic of a single-wire Zener-diode terminated ground check monitoring circuit in accordance with the present disclosure.

FIG. 2 illustrates a schematic of a ground check termination circuit 200 according to embodiments of the present disclosure. The ground check termination circuit 200 includes a power source 202 (e.g., a voltage source), a current sensor 204 for measuring current $I_{gc}$, and a first resistor 206 providing an internal resistance $R_{int}$, wherein the current sensor 204 and the first resistor 206 are arranged in series between the power source 202 and a ground check terminal 208, which may be connected to a cable pilot wire.

The ground check termination circuit 200 further includes a single insulated ground check wire 218 (hereinafter "ground check wire"), a second resistor 210 providing an equivalent resistance $R_p$ of the ground check wire 218, and an AC voltage $V_{ac}$ 220. A termination device 222, such as a Zener diode, is connected between ground check wire 224 and a ground conductor (collectively shown as elements 226 and 228). In some embodiments, AC voltage $V_{ac}$ 220 may provide an equivalent voltage of the voltages induced on a pilot conductor (collectively shows as elements 218 and 224) and the ground conductor 226, 228.

The ground check termination circuit 200 further includes a third resistor 230 electrically connected to a ground terminal 232, which may be connected to a cable ground wire. In some embodiments, the third resistor 230 provides an equivalent resistance $R_g$ of the ground conductor 226, 228. Between the ground check terminal 208 and the ground terminal 232 a ground check resistance $R_{gc}$ can be calculated as the sum of the equivalent resistance $R_p$ of the ground check wire 218, 224 and the equivalent resistance $R_g$ of the ground conductor 226, 228.

Figure 3:
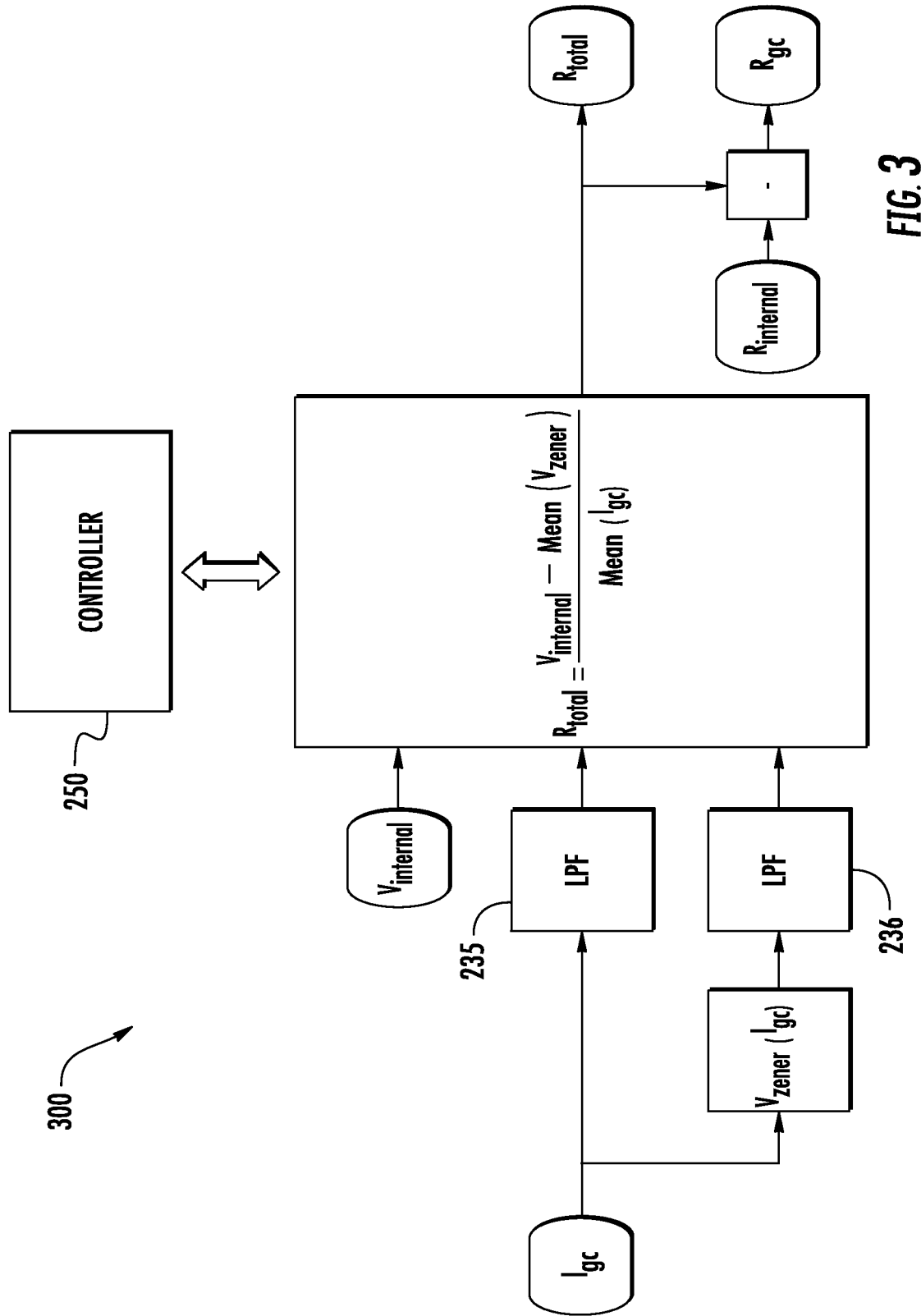
FIG. 3 illustrates a calculation of a ground check resistance according to embodiments of the present disclosure.

Turning now to FIG. 3, with reference to FIG. 2, a calculation 300 of $R_{gc}$ according to embodiments of the present disclosure will be described in greater detail. As shown, the current $I_{gc}$ from the current sensor 204 and the voltage across the termination device 222 are delivered through a pair of low pass filters 235 and 236 to remove AC noise from the signal, and together with the voltage $V_{internal}$ of the power source 202, are used to calculate a total resistance $R_{total}$. In some embodiments, $V_{zener}$ is a fixed voltage in which the non-linear area is to be determined, and the voltage $V_{internal}$ is known and controlled/adjustable.

As shown, $R_{total}$ is determined by subtracting the mean $V_{zener}$ from $V_{internal}$, and then dividing by the mean current $I_{gc}$. $R_{internal}$ is then subtracted from $R_{total}$ to determine the ground check resistance, $R_{gc}$. In one non-limiting embodiment, $R_{gc}$ is approximately 29 ohms or less. It will be appreciated that $R_{total}$ and/or $R_{gc}$ may be determined using a controller 250, which can represent a portion of the ground check monitor 402.

The ground check termination circuit 200 of FIG. 2 can represent the ground check monitoring system 400 depicted in FIG. 4. For example, the voltage source 202, the current sensor 204, the first resistor 206, and the ground check terminal 208 can represent a portion of the ground check monitor 402. The insulated ground check wire 218, 224, the second resistor 210, the AC voltage $V_{ac}$ 220, and the termination device 222, can represent a portion of the trailing cable 100 (e.g., as depicted in FIG. 4). A Zener diode can represent the termination device 404 depicted in FIG. 4.

The voltage source 202 can represent an internal circuit voltage generated by a ground check monitoring device (e.g., the ground check monitor 402). The voltage source 202 can provide, as an example, approximately 24 volts-direct current (Vdc). The first resistor 206 can represent an internal sense resistance (or internal resistance) in the ground check monitoring device. The first resistor 206 may have a resistance value of, e.g., approximately 132 ohms. The second resistor 210 can represent the resistance of the ground check line or pilot wire 218, 224 in the trailing cable 100. The third resistor 230 may represent the resistance of the ground conductor 226, 228 in the trailing cable 100. In some non-limiting embodiments, the third resistor 230 may have a value of less than 4 ohms.

In one embodiment, the termination device 222 may be located at a junction box of the equipment receiving the trailing cable 100. At the other end of the trailing cable 100 (i.e., at the location of a voltage source 202), the insulated ground check wire 218 and the ground conductor 228 can be connected to terminals of a ground check monitor, which measures and monitors the electrical characteristics between terminals of the ground check monitor. As shown in FIG. 2, the termination device 222 can be coupled to the ground check wire 224 and to the ground wire 226. As further shown in FIG. 2, a negative terminal of the voltage source 202 can be coupled to the ground conductor 228 such that the termination device 222 can be considered to be coupled between the ground check wire 218, 224 and the ground conductor 226, 228.

In operation, the ground check monitor detects a fault condition using the ground check termination circuit 200. Upon detecting the fault condition, the trailing cable 100 may be de-energized. Alternatively, if no fault condition exists, the ground check monitor permits the trailing cable 100 to be energized (or remain energized). The ground check termination circuit 200 allows for the voltages of at the ground check terminal 208 and the ground terminal 232 to be monitored and measured, and for the ground check resistance $R_{gc}$ to be calculated as part of the ground check operation or monitoring.

Figure 5:
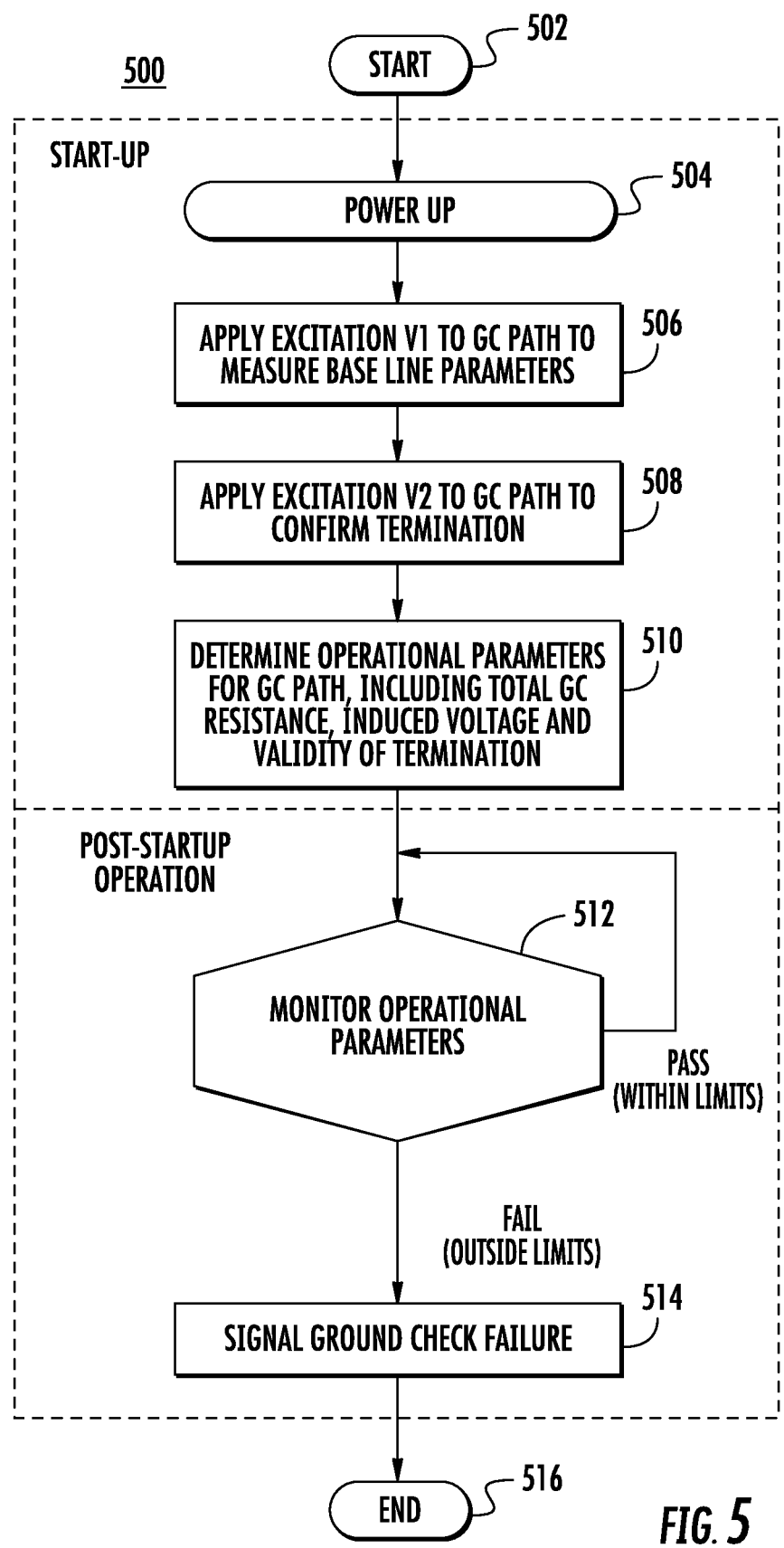
FIG. 5 is a flow chart illustrating a method of operating the single-wire Zener-diode terminated ground check monitoring circuit of FIG. 2.

FIG. 5 is a method 500 that illustrates a method for ground fault monitoring. The method 500 can be used with ground check termination circuit 200 of FIG. 2. The method 500 begins at block 502, and moves to block 504, where a ground check monitoring device coupled to the trailing cable is powered up. At block 506, the ground check monitoring device applies an excitation voltage V1 to an insulated ground check wire, such as insulated ground check wire 218, and measures the voltage and current at the ground check terminal 208 and the ground terminal 232. The excitation can be an application of a known voltage V1 to the ground check wire 218. At block 508, the ground check monitoring device applies an excitation voltage V2 to an insulated ground check wire, and measures the voltage and current at the ground check terminal 208 and the ground terminal 232.

At block 510, the ground check monitoring device determines normal/standard operations parameters for the insulated ground check wire 218 (e.g., GC path). The determination of normal/standard operations parameters can include determining values for the total ground check resistance Rgc, induced AC voltage 220, and status of termination 222.

Blocks 504 to 510 may be considered a startup phase. The startup phase can end once normal operation parameters are determined and if it is further determined that a termination resistance of the monitoring system is not shorted or opened.

The method of operation 500 moves to block 512 where the operational parameters continue to be measured. Voltage and current at the ground check terminal 208 and the ground terminal 232 can be re-measured and can be used to calculate resistance values for the pilot wire 218, 224 and the ground conductor 226, 228. If the measured or calculated values exceed preset limits, a fault condition can be signaled at block 514.

If the currently measured operational parameters at block 512 compare well to the normal/standard operational parameters determined at block 510 and have not exceeded preset limits, then the method of operation 500 continues to monitor the operational parameters. If the currently measured operational parameters do not compare well to the normal/standard operational parameters or have exceeded preset limits, then the method of operation 500 signals a ground check failure at block 514. The method of operation 500 may end at 516. It should be noted that block 512 and 514 may be defined as operations being conducted during normal/standard operations following a startup operation of the ground check monitoring apparatus.

It will be appreciated that the method 500 may be performed in part using a controller, such as the controller 250 shown in FIG. 3. In general, the controller can provide the functionality described herein for taking, for example, voltage and current measurements and calculating, for example, resistance values. The controller 250 can measure voltage and current of the ground check terminal and the ground terminal. The controller 250 can further include a memory or other storage device for storing any measured value or any calculated value (e.g., the resistances of the insulated ground check wire 218, 224 and resistance of the ground conductor 226, 228). The controller 250 can also store one or more predetermined values or thresholds that can be used for comparison to one or more measured or calculated values. For example, the controller 250 can store any number of predetermined values related to expected voltage or current of the ground check terminal and/or the ground terminal. The controller 250 can be programmed to adjust the stored threshold values and can be programmed to respond as desired to a detected ground check failure (e.g., by signaling an alarm and/or de-energizing one or more conductors within the trailing cable 100). Further, any measurement and any comparison made by the controller 250 can be based on approximate measurement values and comparison of any measured or calculated values can be made on an approximate value basis.

In some embodiments, the controller 250 is capable of determining the ground check resistance, which can then be compared to expected values or predetermined thresholds. For example, if the value of the ground check resistance exceeds a certain predetermined threshold, a ground check failure can be signaled or flagged. Further, in response thereto, the controller 250 can de-energize the trailing cable. Similarly, if the value of any of the other resistors in the ground check termination circuit exceeds a certain predetermined threshold, a ground check failure can also be signaled or flagged and, in response thereto, the controller 250 can also de-energize the trailing cable. The controller 250 can provide the functionality for making such comparisons and signaling any determined ground check failure.

In some embodiments, the controller 250 may be or include a general-purpose computer or network of general-purpose computers programmed to perform desired input/output functions. The controller 250 may also include communication devices, data storage devices, and software. The user interface system may include devices such as touch screens, keyboards, user pointing devices, displays, printers, etc. to allow a user to input commands and/or data and/or to monitor the ground check apparatus via the controller. The embodiments of the disclosure are not limited in this context.

While the present disclosure has been described with reference to certain approaches, numerous modifications, alterations and changes to the described approaches are possible without departing from the spirit and scope of the present disclosure, as defined in the appended claims. Accordingly, it is intended that the present disclosure not be limited to the described approaches, but that it has the full scope defined by the language of the following claims, and equivalents thereof. While the disclosure has been described with reference to certain approaches, numerous modifications, alterations and changes to the described approaches are possible without departing from the spirit and scope of the disclosure, as defined in the appended claims. Accordingly, it is intended that the present disclosure not be limited to the described approaches, but that it has the full scope defined by the language of the following claims, and equivalents thereof.

The invention claimed is:

1. A ground check monitoring apparatus comprising:
a voltage source connected to a single insulated ground check wire, a pilot conductor, and a ground conductor, wherein the pilot conductor has a first resistance, and the ground conductor has a second resistance;
a termination device connected between the pilot conductor and the ground conductor;
a ground check terminal connectable to a cable pilot wire and a ground terminal connectable with a cable ground wire, wherein voltage and current measured at the ground check terminal and the ground terminal are used to determine a ground check resistance wherein an internal sense resistance represents an internal resistance;
a first low pass filter receiving a voltage of the termination device, and a second low pass filter receiving a ground circuit current; and
a controller, wherein the controller determines the ground check resistance by subtracting the internal resistance from a total resistance, the total resistance determined according to:

$$R_{total} = \frac{V_{internal} - \text{Mean}(V_{termination})}{\text{Mean}(I_{gc})}$$

wherein $I_{gc}$ is the ground circuit current detected by a current sensor, wherein $V_{internal}$ is a known value, and wherein $V_{termination}$ is the voltage of the termination device, wherein the controller signals a ground check failure and de-energizes a trailing cable if a calculated value of the ground check resistance exceeds a predetermined threshold.

2. The ground check monitoring apparatus of claim 1, wherein the termination device is a Zener diode.

3. The ground check monitoring apparatus of claim 1, wherein the ground conductor is coupled to the voltage source.

4. The ground check monitoring apparatus of claim 1, wherein the ground check resistance is a sum of the first resistance and the second resistance.

5. The ground check monitoring apparatus of claim 1, wherein the termination device is electrically connected in series with the pilot conductor and the ground conductor.

6. A ground check termination circuit, comprising:
a voltage source connected to a single insulated ground check wire, a pilot conductor, and a ground conductor, wherein the pilot conductor has a first resistance, and the ground conductor has a second resistance;
a termination device connected between the pilot conductor and the ground conductor;
a ground conductor terminal connected to the single insulated ground check wire and connectable to a cable pilot wire; and
a ground terminal connectable with a cable ground wire, wherein voltage and current measured at the ground check terminal and the ground terminal are used to determine a ground check resistance, wherein an internal sense resistance represents an internal resistance;
a first low pass filter receiving a voltage of the termination device, and a second low pass filter receiving a ground circuit current; and
a controller, wherein the controller determines the ground check resistance by subtracting the internal resistance from a total resistance, the total resistance determined according to:

$$R_{total} = \frac{V_{internal} - \text{Mean}(V_{termination})}{\text{Mean}(I_{gc})}$$

wherein $I_{gc}$ is the ground circuit current detected by a current sensor, wherein $V_{internal}$ is a known value, and wherein $V_{termination}$ is the voltage of the termination device, wherein the controller signals a ground check failure and de-energizes a trailing cable if a calculated value of the ground check resistance exceeds a predetermined threshold.

7. The ground check termination circuit of claim 6, wherein the termination device is a Zener diode or a resistor.

8. The ground check termination circuit of claim 6, wherein the ground conductor is coupled to the voltage source.

9. A method for precision measurement of a ground check determination circuit, the method comprising:
providing a voltage source connected to a single insulated ground check wire, a pilot conductor, and a ground conductor, wherein the pilot conductor has a first resistance, and the ground conductor has a second resistance;
providing a termination device connected between the pilot conductor and the ground conductor;
providing a ground check terminal connected to the single insulated ground check wire and connectable to a cable pilot wire, and providing a ground terminal connectable with a cable ground wire;
determining a ground check resistance from current and voltage measured at the ground check terminal and the ground terminal, respectively, by subtracting an internal resistance of the single insulated ground check wire from a total resistance, the total resistance determined according to:

$$R_{total} = \frac{V_{internal} - \text{Mean}(V_{termination})}{\text{Mean}(I_{gc})}$$

wherein $I_{gc}$ is a current detected by a current sensor, $V_{internal}$ is a known value, and $V_{termination}$ is a voltage of the termination device and wherein a first low pass filter receives the voltage and a second low pass filter receives the current;
signaling a ground check failure if the ground check resistance exceeds a predetermined threshold; and de-energizing a trailing cable if a calculated value of the ground check resistance exceeds the predetermined threshold.

10. The method of claim 9, further comprising determining the ground check resistance as a sum of the first resistance and the second resistance.

\* \* \* \* \*